United States Patent
Tafjord et al.

(10) Patent No.: US 11,906,903 B2
(45) Date of Patent: Feb. 20, 2024

(54) REAL TIME REGISTRATION IN LITHOGRAPHY SYSTEM

(71) Applicant: Visitech AS, Drammen (NO)

(72) Inventors: Øyvind Tafjord, Tolvsrød (NO); Trond Jørgensen, Drammen (NO); Endre Kirkhorn, Drammen (NO); Roy Almedal, Krokkleiva (NO)

(73) Assignee: Visitech AS, Drammen (NO)

( * ) Notice: Subject to any disclaimer, the term of this patent is extended or adjusted under 35 U.S.C. 154(b) by 0 days.

(21) Appl. No.: 17/625,990

(22) PCT Filed: Jun. 29, 2020

(86) PCT No.: PCT/EP2020/068286
§ 371 (c)(1),
(2) Date: Jan. 10, 2022

(87) PCT Pub. No.: WO2021/004826
PCT Pub. Date: Jan. 14, 2021

(65) Prior Publication Data
US 2022/0276566 A1    Sep. 1, 2022

(30) Foreign Application Priority Data
Jul. 11, 2019 (NO) .................................. 20190876

(51) Int. Cl.
G03F 7/20     (2006.01)
G03F 7/00     (2006.01)

(52) U.S. Cl.
CPC ........ G03F 7/70133 (2013.01); G03F 7/7055 (2013.01); G03F 7/70141 (2013.01)

(58) Field of Classification Search
CPC ............. G03F 7/70133; G03F 7/70141; G03F 7/7055; G03F 7/70291; G03F 9/7007;
(Continued)

(56) References Cited

U.S. PATENT DOCUMENTS

2005/0128450 A1    6/2005  Schroeder
2005/0264777 A1   12/2005  Gardner et al.
(Continued)

FOREIGN PATENT DOCUMENTS

CN    107430353 A    12/2017
EP    3040779 A1      7/2016
(Continued)

OTHER PUBLICATIONS

Search Report issued in Norwegian Application No. 20/190,876; dated Feb. 11, 2020 (2 pages).
(Continued)

*Primary Examiner* — Mesfin T Asfaw
(74) *Attorney, Agent, or Firm* — Osha Bergman Watanabe & Burton LLP

(57) ABSTRACT

A device for measuring reference points in real time during lithographic printing includes a light source providing an exposure beam; a light modulator modulating the exposure beam according to an exposure pattern; a measurement system configured to measure a position of a number of alignment marks previously arranged on a substrate; and an exposure optical system comprising a control unit. The exposure optical system delivers the modulated exposure beam as an image provided by the light modulator onto the substrate. The exposure system control unit is configured to calculate the orientation of the substrate based on the position of the alignment marks and control the delivering of the modulated exposure beam relative to the calculated orientation of the substrate.

16 Claims, 23 Drawing Sheets

(58) Field of Classification Search
CPC .... G03F 9/7065; G03F 9/7088; G03F 9/7096; G03F 7/2057; G03F 7/20; G03F 7/70275; G03F 7/70883; G03F 7/70383; G03F 7/0007; G03F 7/70041; G03F 7/70475; G03F 7/70358; G03F 7/70008; G03F 7/70391; G03F 7/704; G03F 7/70558; H01L 23/544; H01L 27/156; H01L 33/32; H01S 5/026; H01S 5/4025; H01S 5/3013
See application file for complete search history.

(56) References Cited

U.S. PATENT DOCUMENTS

| | | | |
|---|---|---|---|
| 2012/0081682 A1* | 4/2012 | Ahn | G03F 9/70 355/77 |
| 2018/0329292 A1 | 11/2018 | Kanehara et al. | |
| 2019/0294051 A1* | 9/2019 | Johnson | G03F 7/70383 |

FOREIGN PATENT DOCUMENTS

| | | |
|---|---|---|
| TW | 201032004 A | 9/2010 |
| TW | 201516580 A | 5/2015 |
| WO | 2015060972 A1 | 4/2015 |

OTHER PUBLICATIONS

International Search Report issued in International Application No. PCT/EP2020/068286, dated Oct. 14, 2020 (3 pages).
Written Opinion issued in International Application No. PCT/EP2020/068286; dated Oct. 14, 2020 (8 pages).
International Preliminary Report on Patentability issued in International Application No. PCT/EP2020/068286; dated Oct. 25, 2021 (14 pages).
Office Action issued in Taiwanese Application No. 109123127; dated Sep. 26, 2023 (16 pages).

* cited by examiner

REAL TIME REGISTRATION IN LITHOGRAPHY SYSTEM

The present invention relates to a process and a device for exposing a photo sensitive material for fine line direct imaging lithography with requirements for a high number of reference points to be measured, where camera capture, imaging analyses, calculation and real time data transfer and printing is all done in real time.

Laser Direct Imaging (LDI) and Direct Imaging (DI) lithography machines are well proven in the market and are used in various lithography application like PCB and wafer lithography.

Orbotechs' Novougo and Schmoll's MDI TT are typical example of such machines.

LDI and DI machines have some limitation as they require registration/measurement of fiducials & reference points to utilize the advantage of position, rotation and pattern warping compared to conventional contact exposure machines and steppers. The registration is time consuming and the Direct imaging lithography is often slower than conventional contact exposure machines and steppers. However, the advantage of the accuracy you can achieve with the registration followed by the calculations of position, rotation and warping resulting in a more accurate layer-to-layer print is very advantageous when smaller and smaller line/space is used in the lithography pattern.

In (laser) direct imaging lithography systems (LDI, DI), the measurements of reference points/fiducials in the media to be exposed (PCB, Wafer, RDL, Display, film etc.) is a vital part of the process. The media that contains the photosensitive material that are to be exposed with a pattern, will have a position error and rotation error when placed into a lithography machine. Further, such media might already have printed pattern exposed to one or both sides. The pattern to be printed will need to fit the media's position and rotation, existing pattern, existing reference points and the interconnection points between existing and new patterns that are to be applied to the media. Therefore, the reference points/registration points are defined in such patterns to be measured and then the pattern to be printed must be altered to fit the real position, rotation and warping of the media and existing or to be exposed pattern.

The measured position/coordinates of such reference points are transferred from the capturing camera and analysis system to the printing part of the lithography system. Lithography machines with registration systems and printing system is typically compromising laser scanner (such as Orbotech's Nouvogo), or modulating light projectors (DLP/LCOS etc.) (such as Schmoll-maschinen's MDI TT) and these coordinated are used to calculate the position, rotation and warping of the pattern to be printed.

Typically, such registration coordinates will be transferred to the lithography computing/printing system and new pattern files will be calculated and thereafter printed based on these calculations. This is done more or less in real time, where some use software and transfer data to and from a computer/CPU, while other systems will change the pattern in real time using FPGA/video processors or similar.

Such measurements are typically done on a few to a few hundreds of reference points. The registration of these reference points is time consuming and will slow down throughput of such lithography systems. This is compensated with lithography machines that have a measurement station on a first medium while a second medium is printed, such that shadow time of the actual printing is used to do the measurements. However, the printing time of such lithography systems is often a few seconds to several minutes, therefore it is limited how many measurements you can do before you start reducing throughput of the system or the process if many machines are utilized.

When the number of reference point/fiducials is too high, the measurements are very time consuming. In combination with smaller feature size in the patterning, driven by cell phones, smart watches and advanced packaging for embedded dies etc, (see FIG. 1a) that require higher accuracy in the measurements, the time consumption is even higher. A typical DI PCB lithography machine will be able to perform coordinated registering/measuring with a panel side to panel side accuracy of 5-15 µm. New fine line application will require registration accuracy down to 1 µm and below into the nanometer area.

Such accurate measurements are difficult to achieve, and on existing high accuracy and fine line (10 um-x00 nm Line/Space) lithography systems (like steppers, such as Rudolph's Jetstep 2300 system), special measurement equipment is used, such as Rudolph Firefly series etc. When a measurement machine is used, the measured data will need to be transferred back to the lithography system for new pattern calculation or with already calculated and altered pattern from external processing (position, warping rotation etc). This process is often slow and done through the factories process SW and not done in real time. Further the measurements are done outside the lithography system such that required accuracy can be challenging to achieve, as the measurement and lithography equipment does not share the same opto-mechanical systems. Sharing the opto-mechanical system is an advantage with respect to opto-mechanical thermal effects of camera systems and lithography systems. This will require more accurate and sophisticated calibration and create uncertainty that can effect yield and factory throughout, When these two opto-mechanical systems are combined, a higher accuracy of registration measurements is possible to achieve, ref Visitech Lithography systems LLS photo heads LLS 10 and LLS 04 where registration camera is positioned such that the camera and the projector share the same optical path, and hereby the same opto-mechanics. Ref Visitech's European patent application number: 14200630.3. This system is illustrated in FIG. 1.

Therefore, LDI and DI machines/direct imaging lithography systems has a throughput and cost limitation factor if the number of reference points are too high and/or the registration accuracy requirements are very high.

New methods of advanced packaging, embedded dies, FOWLP, FOPLP, 2, 5 and 3D electronics and higher accuracy requirements for pattern line/space, requires that line/space are small, such as below 10 µm and down to nanometer area. These fine line/space requirements will also require that registration and position/warping accuracy is higher.

As the skilled person will know, a die, in the context of integrated circuits, is a small block of semiconducting material on which a given functional circuit is fabricated. In embedded die packaging, components are embedded inside the substrate using a multi-step manufacturing process. A die, multiple dies, MEMS or passives can be embedded in a side-by-side fashion in the core of an organic laminate substrate. The object of the invention is to provide a method and a device for measuring reference points in real time during lithographic printing which reduces the problems of prior art.

The object of the invention is achieved by means of the features of the patent claims.

In one embodiment, a device for measuring reference points in real time during lithographic printing comprises a light source providing an exposure beam, a light modulator modulating the exposure beam according to an exposure pattern, a measurement system configured to measure a position of a number of alignment marks previously arranged on a substrate, and an exposure optical system comprising a control unit.

The exposure beam light source may for example be an UV light source. The measurement system may for example use a beam of visible light, or any other convenient wavelength of the light.

In one embodiment, the light source comprises multiple light sources, for example a number of LED units, with at least one wavelength.

The exposure optical system delivers the modulated exposure beam as an image provided by the light modulator onto the substrate. The modulated exposure beam represents the image to be exposed onto the material for lithographic printing.

In one embodiment, the exposure optical system comprises a projection lens and the light source/light sources are positioned to be optically coupled through the projection lens. The light sources may in other embodiments be positioned in the bottom part of the exposure optical system, surrounding the projection lens.

The alignment marks may be dedicated marks printed or physical placed or arranged in any other way on the substrate. The alignment marks may be any suitable mark already on the substrate for which the location is known and thus can be used for calculating the orientation of the substrate. In one embodiment the electrical connection pads on a die are used as alignment marks. In alternative embodiments, body or parts of the body of a die can be used as alignment marks.

The measurement system is a system for measuring the position of the alignment marks. The exposure optical system control unit is configured to calculate the orientation of the substrate based on the position of the alignment marks and control the delivering of the modulated exposure beam relative to the calculated orientation of the substrate.

In one embodiment, the measurement system comprises a camera or a camera system. The camera or camera system may be arranged to use direct high data rate transfer directly from the camera chip into a FPGA (field-programmable gate array) or a processor for fast analysis and data transfer to a pattern calculation module inside the exposure optical system control unit.

Contemporary field-programmable gate arrays (FPGAs) have large resources of logic gates and RAM blocks to implement complex digital computations and are therefore suitable for high data rate computations.

The measurement system and the exposure optical system have at least partially concurrent optical paths. For example, can a camera as a part of the measurement system be placed with its picture path within the optical path of the exposure optical system. The camera can share the same optics (such as dichroic beam splitter prism and projection lens, etc.) as the exposure optical system. The camera can share the opto-mechanical structure (optical parts mounting units) with the light source modulator. The light source modulator is for example an electronic light projector based on DMD technology or similar. Any variation in position for the exposed image provided by the exposure optical system caused by both exposure interior (opto-mechanics such as optical part mounting units) and exterior (exposure optical system framework and chassis mechanics) will also be applied to the position of the registration camera as the same mechanics and optical path is shared for both exposure optical system and registration camera. Thus, the requirement for frequent calibration of the relative position offsets of the exposure optical system and the registration camera is not required.

In one embodiment, the camera's image area of interest is positioned close to and mechanically connected to the exposure optical system.

The image area of interest of the camera is a feature that makes it possible to specify a portion of the sensor line. During operation, only the pixel information from the specified portion of the line is transmitted out of the camera. The camera's image area of interest can also specify the width of a frame. In contrast to CCD sensors, as CMOS sensors read the pixels out in parallel, many CMOS sensors also offer the possibility of reading out only a part of an image and thus to be able to concentrate on image areas containing the information relevant to image processing.

In one embodiment, the measurement system defines the camera area(s) of interest to optimize fast camera data transfer. For example, can the measurement system define a special camera area of interest for autofocus laser light reflection detection similar to a line sensor, and utilize the defined special camera area of interest for fast camera data transfer for autofocus calculation and autofocus regulation.

There may also be provided a method measuring reference points in real time during lithographic printing. The method comprises in one embodiment the steps of.

modulate an exposure beam according to an exposure pattern;

measure a position of a number of alignment marks previously patterned on a substrate, deliver the modulated exposure beam as an image provided by the light modulator onto the substrate;

calculate the orientation of the substrate based on the position of the alignment marks and control the delivering of the modulated exposure beam relative to the calculated orientation of the substrate.

The invention will now be described in more detail, and by reference to the accompanying figures.

Figure 1:
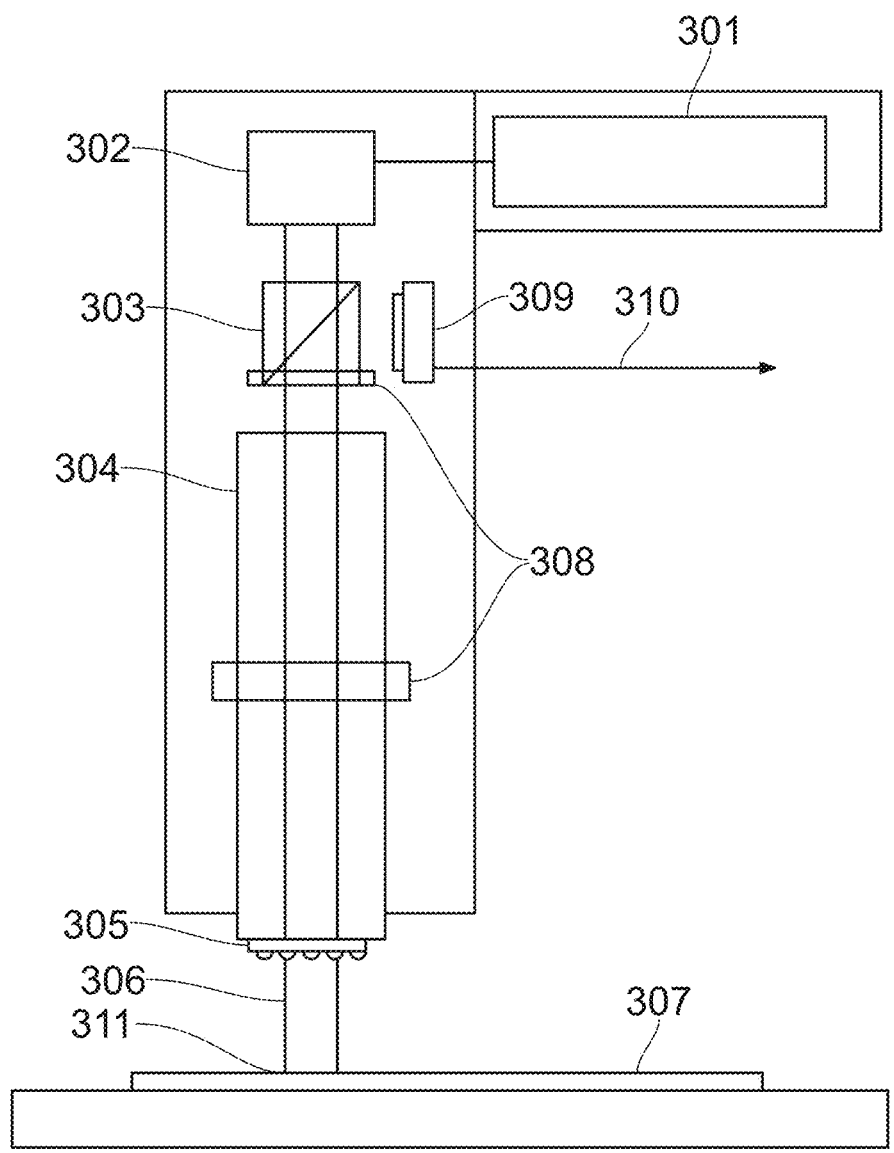
FIG. 1 shows an example of an exposure system for direct imaging lithography.

FIG. 1 shows an example of an exposure system which comprises a light source 302 providing an exposure beam 306, a light modulator 301, 302 modulating the exposure beam 306 according to an exposure pattern, and an exposure optical system 303, 304, 308 delivering the modulated exposure beam as an image 311 provided by the light modulator onto a substrate 307. A measurement system 303, 304, 305, 308, 309 is incorporated in the exposure apparatus and is configured to measure a position of an alignment (fiducial) mark previously patterned on the substrate. The exposure optical system and the measurement system have at least partially concurrent optical paths in this embodiment.

In the following description, the term "photo head" will sometimes be used as a collective term comprising the optical elements of the exposure system.

The exposure system may further comprise a control unit (not shown) which is configured to calculate the orientation of the substrate based on the position of the alignment marks and control the delivery of the modulated exposure beam relative to the calculated orientation of the substrate. We will illustrate this in more detail below.

Figure 1A:
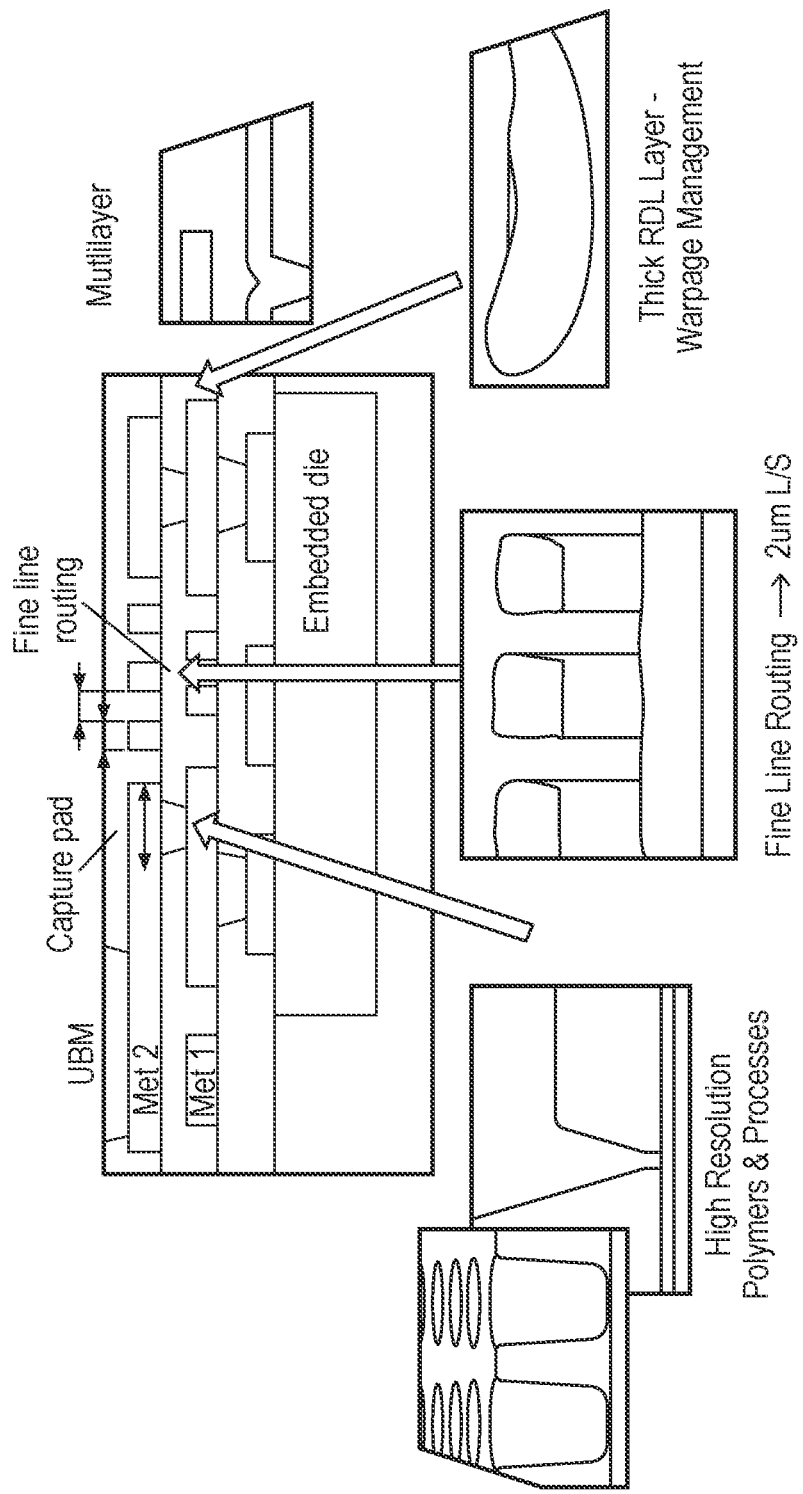
FIG. 1a illustrates schematically various examples of applications of direct imaging lithography.

FIG. 1a illustrates various applications where there is need for smaller feature sizes in the patterning due to the constantly increasing demand for smaller devices. Due to this, there is a need for higher accuracy in the measurement of the alignment marks without increasing the time consumption of the process to any substantial extent.

Figure 1B:
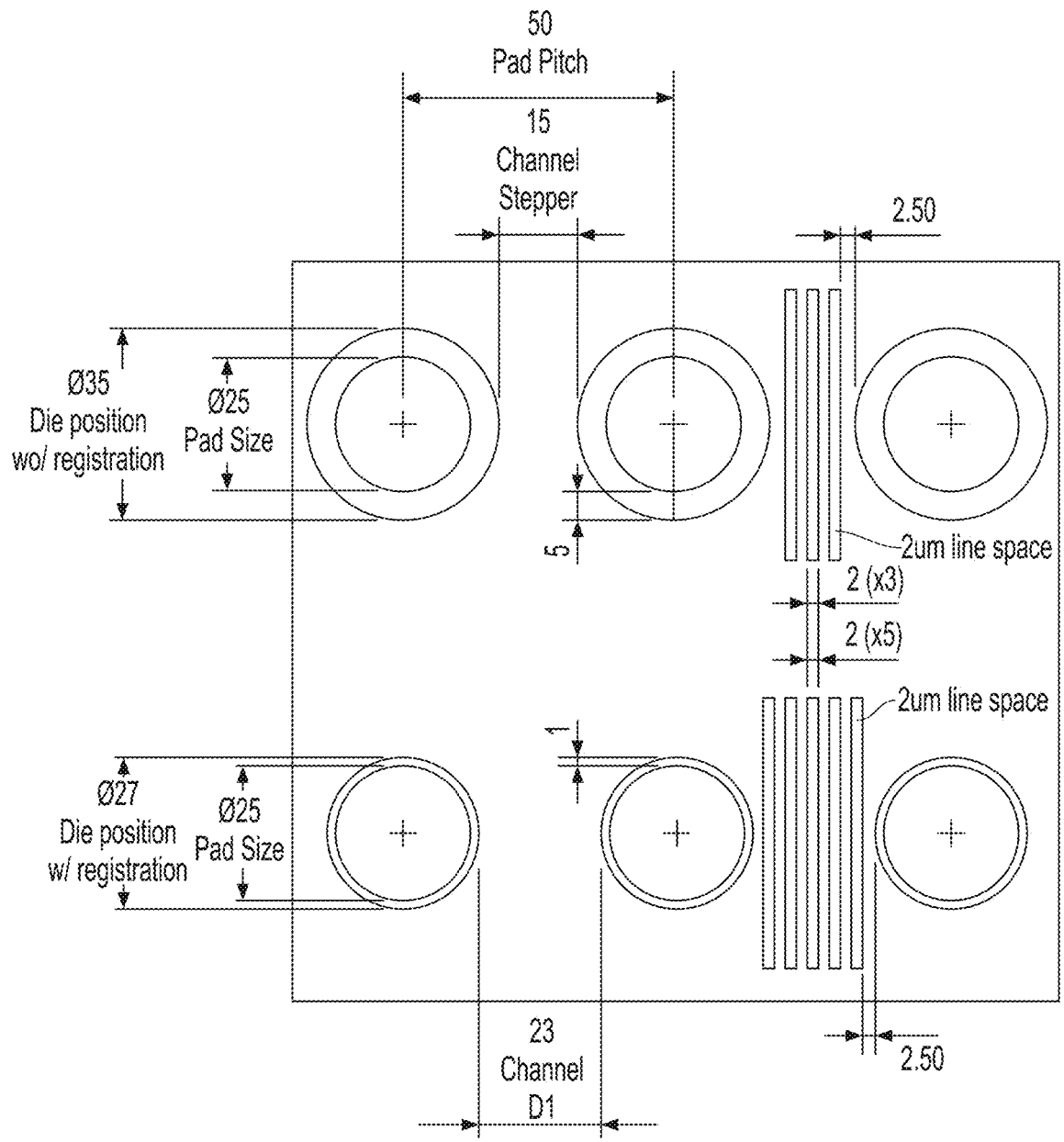
FIG. 1b-1c illustrate examples of components with high requirements for pattern accuracy.
Figure 1C:
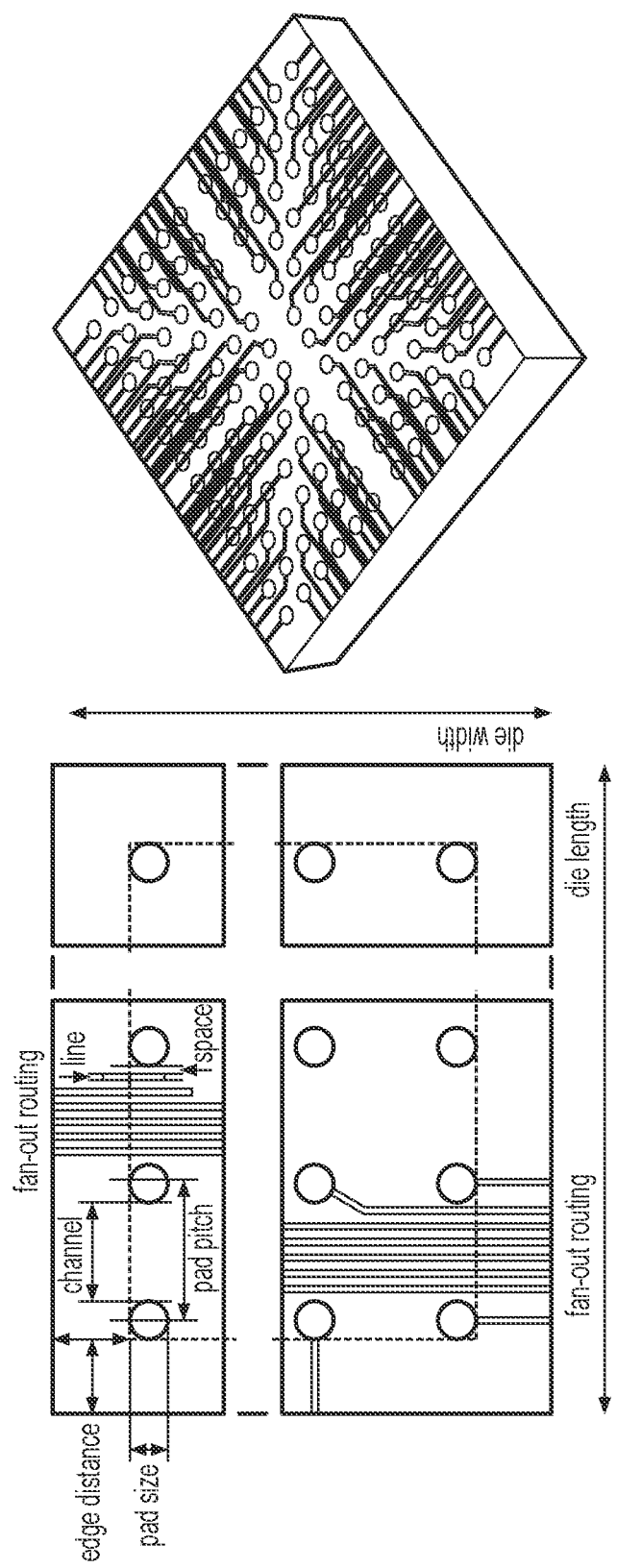

FIG. 1b-1c illustrate examples of components with such high requirements for pattern accuracy. Typically, an embedded die with connection pads will have small pads/electrical connection points in the size range of 25-100 micrometer or less.

In order to optimize the space available for fine line patterning, it is desirable to optimize the usable space between pads on the dies ea. "the channel" Optimization of the available space requires high position accuracy in the application of the dies and pads onto the substrate. And further, for cost reasons, the number of redistribution layers (RDL) can be reduced if the "channel" is optimized.

Typical applications are a Fan Out Panel level packaging process FOPLP or Fan Out Wafer level packaging process FOWLP.

Examples of such application processes can be seen in FIGS. 2a-5.

Figure 2A:
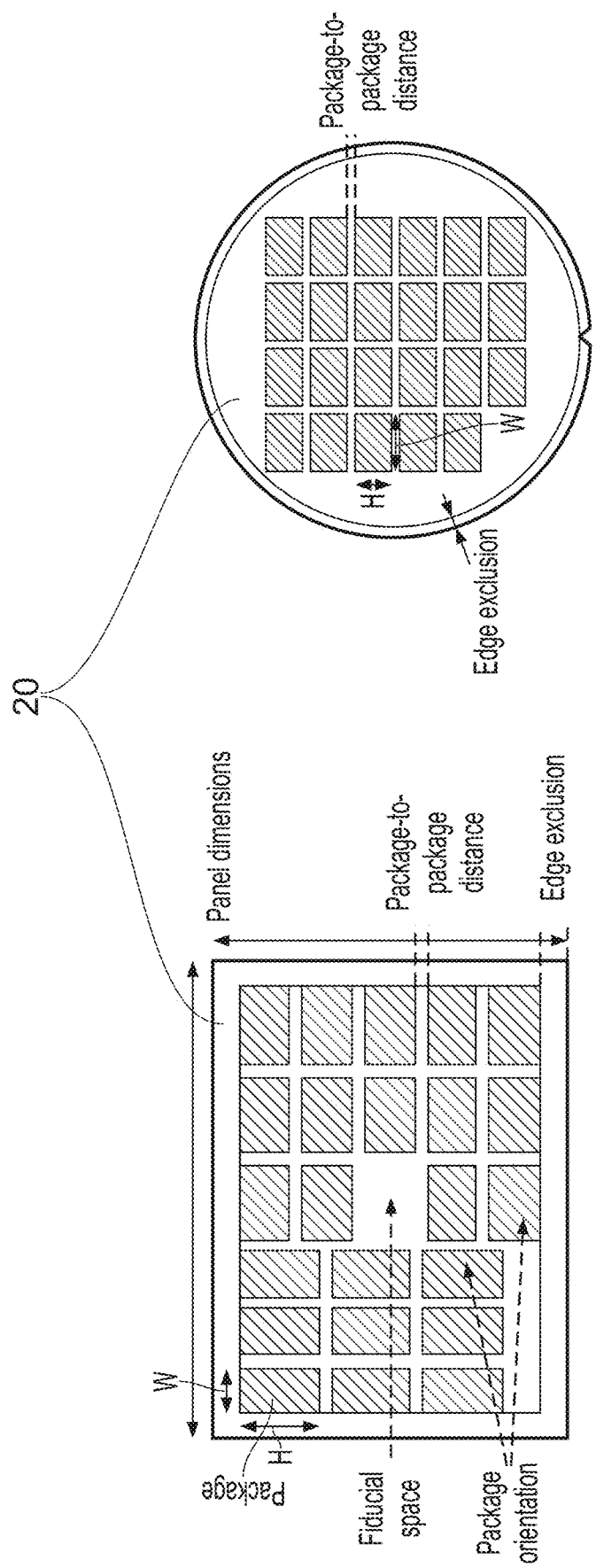
FIG. 2a-2b illustrate examples of embedded dies.
Figure 2B:
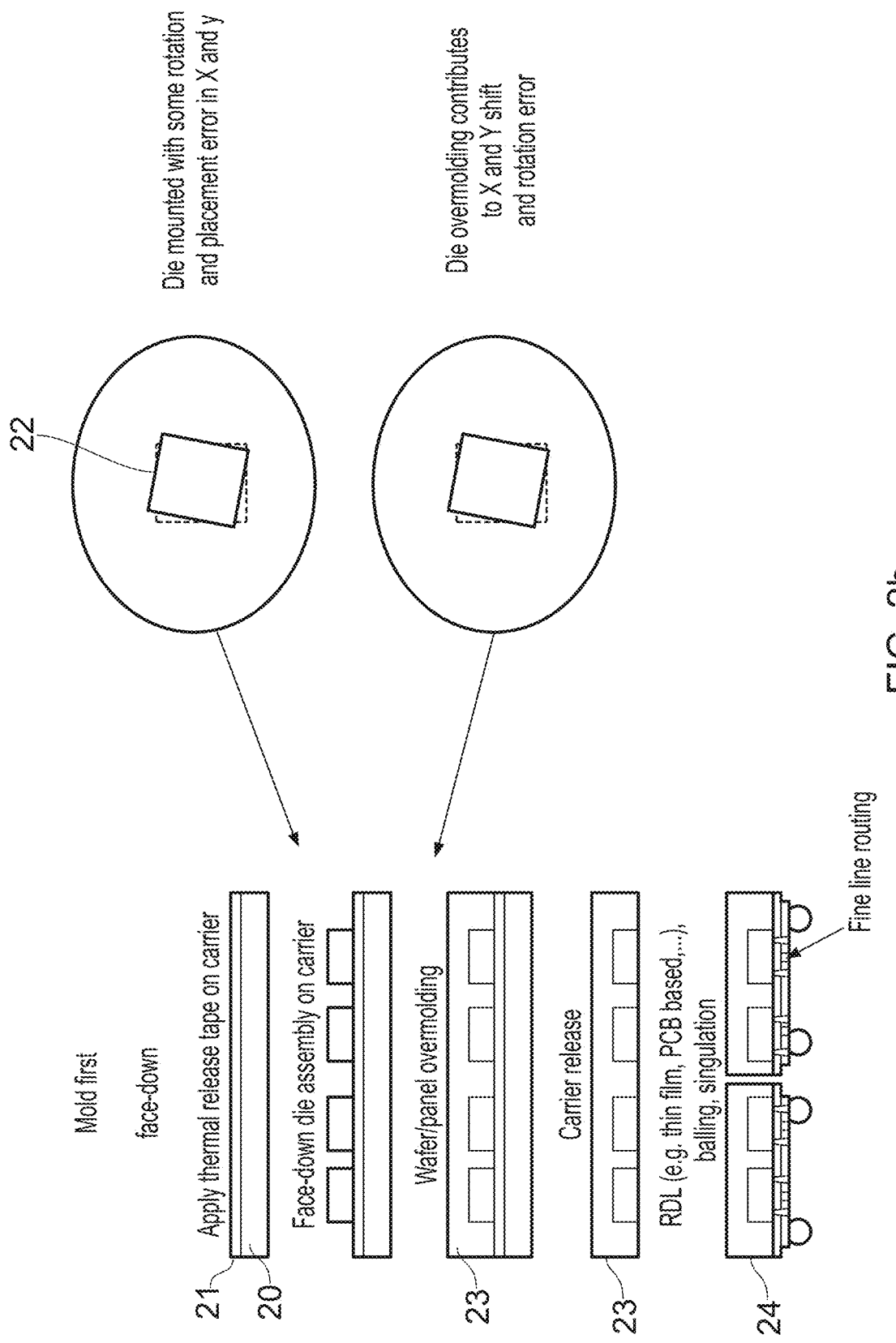
Figure 3:
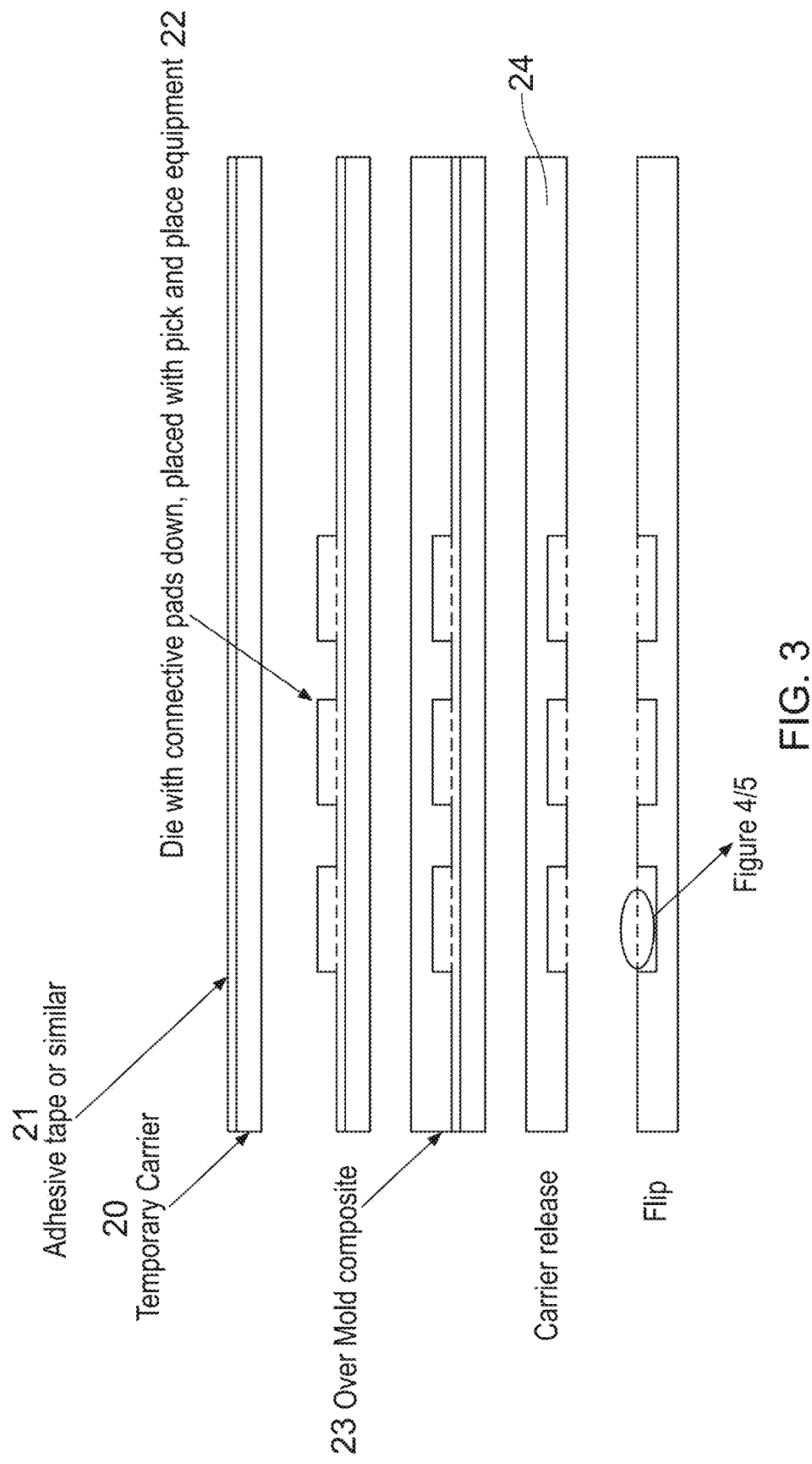
FIG. 3-5 illustrate a typical process of advance packaging with embedded dies.
Figure 4:
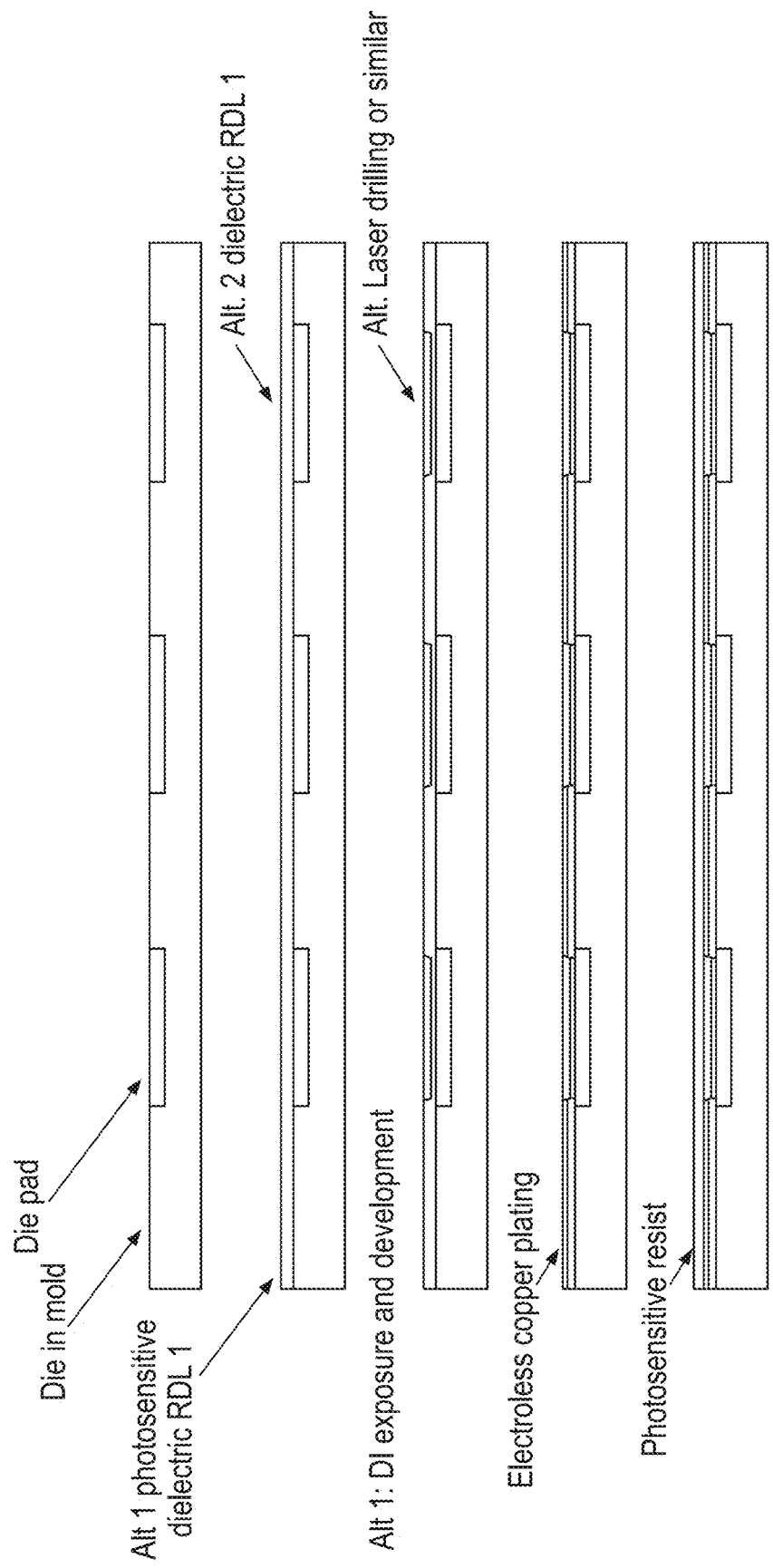
Figure 5:
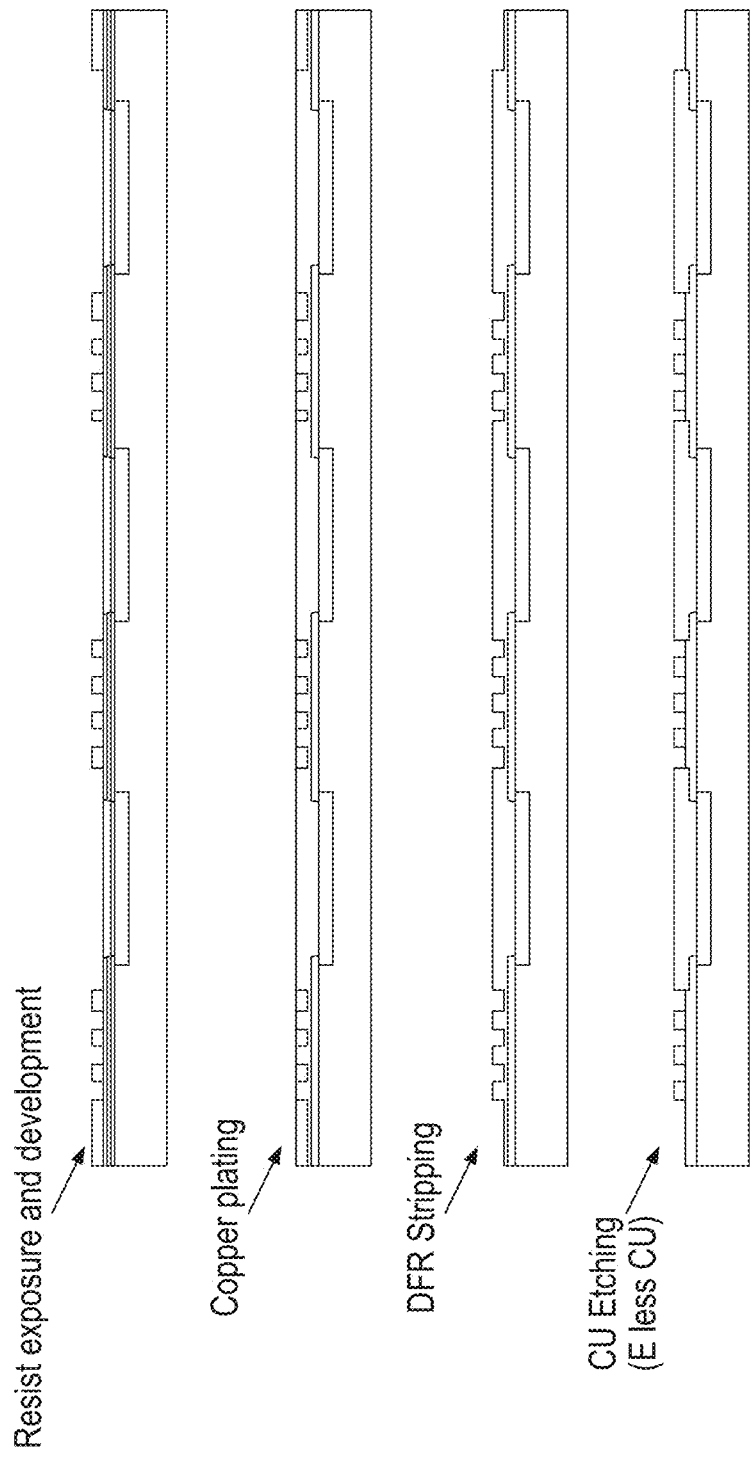

In FIGS. 2b and 3 the first steps are illustrated. An established temporary base layer 20, such as a wafer is provided with an adhesive tape 21 or layer on top. Dies 22 are positioned and arranged onto the adhesive layer/tape 21 with connection pads towards the adhesive tape. Each die can for example be positioned with a "pick and place"-machine and this process will give some position and rotation error due to the accuracy limitations of such pick and place equipment where high speed and throughput are required.

Figure 6B:
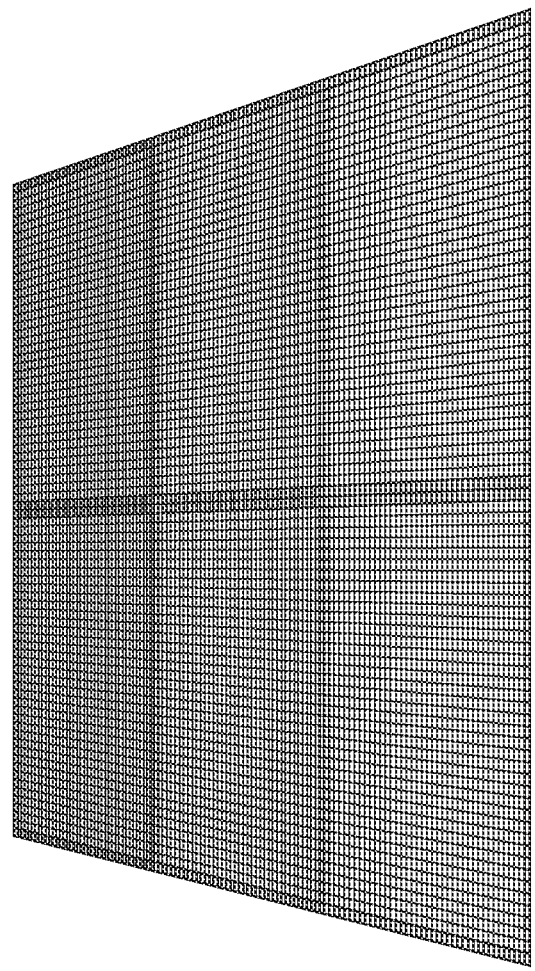
FIG. 6a-6b shows examples of wafer and panel comprising embedded dies.
Figure 6A:
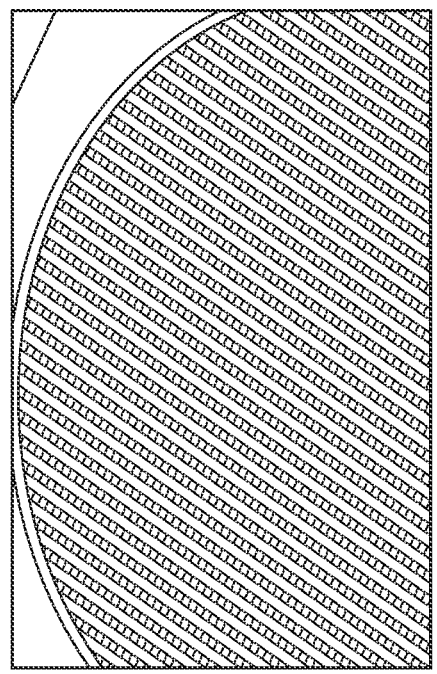
Figure 7:
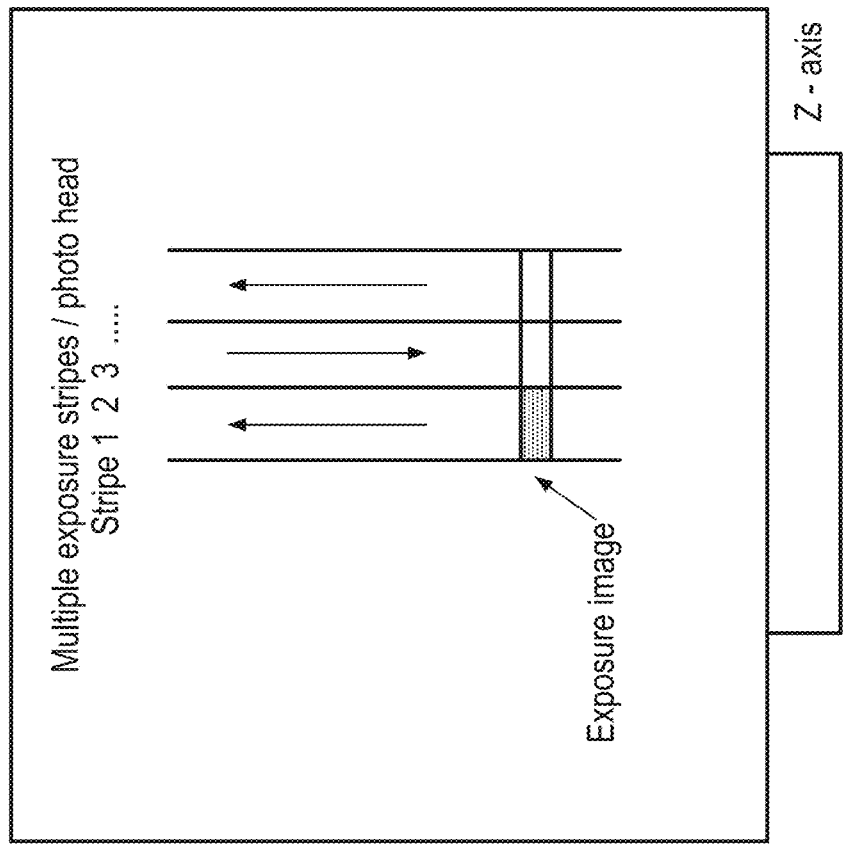
FIG. 7-13 illustrate examples of configurations of the optical elements for exposure and camera capture of a device for direct imaging lithography.
Figure 7:
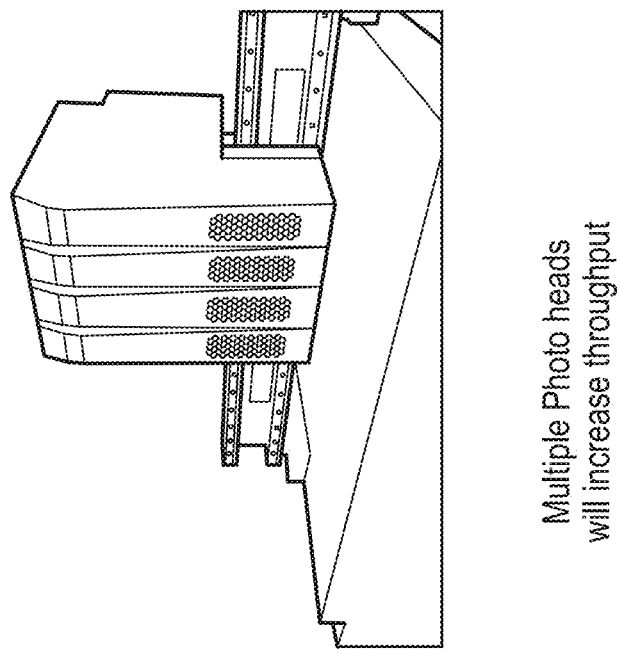
Figure 8:
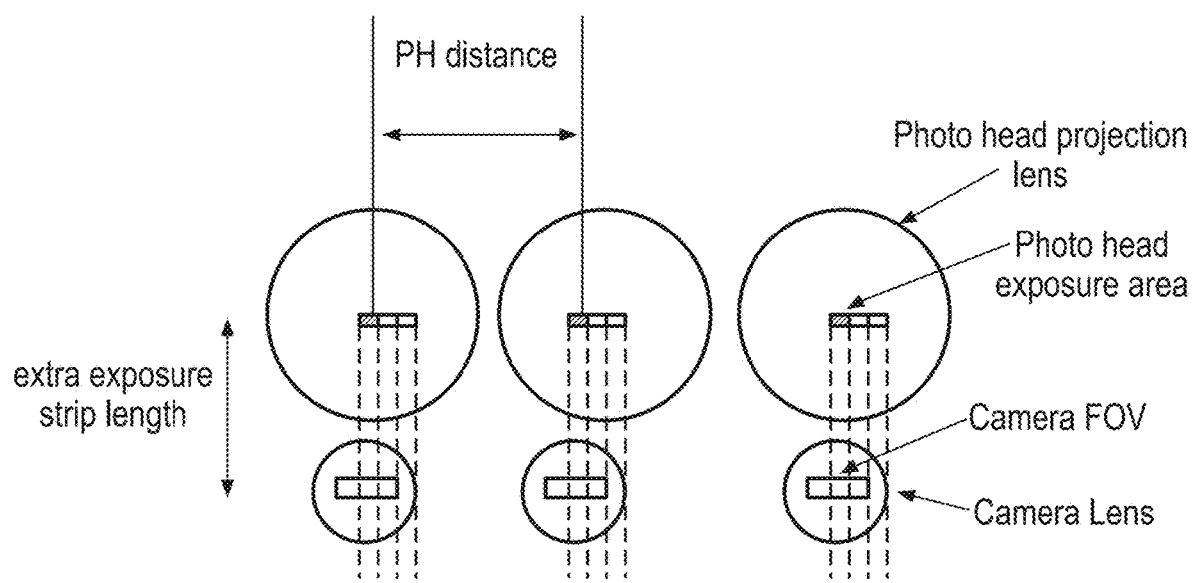
Figure 9:
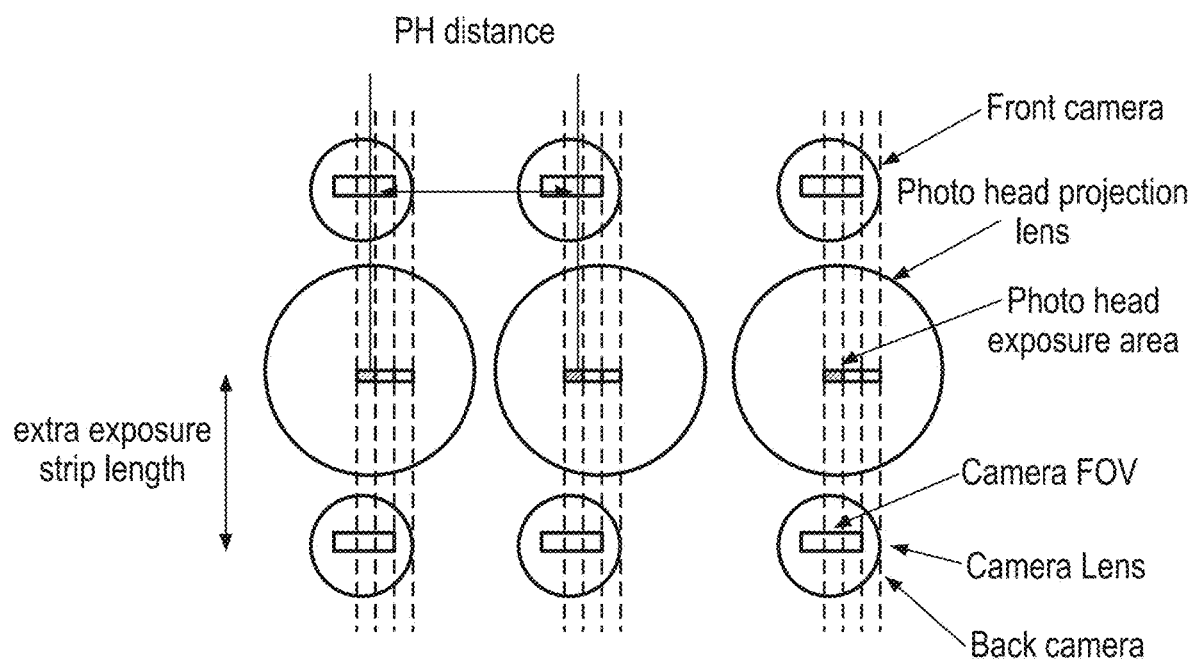
Figure 10:
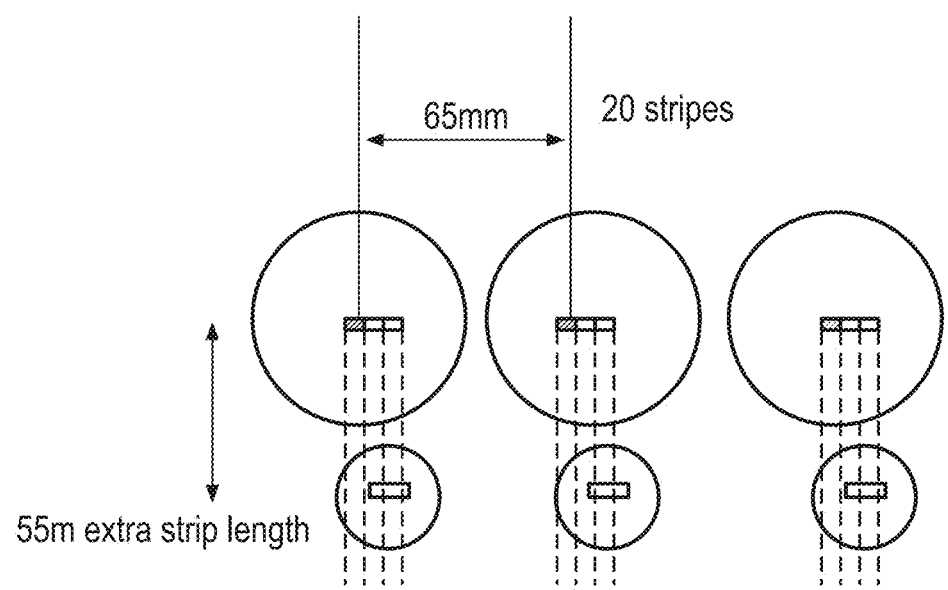
Figure 11:
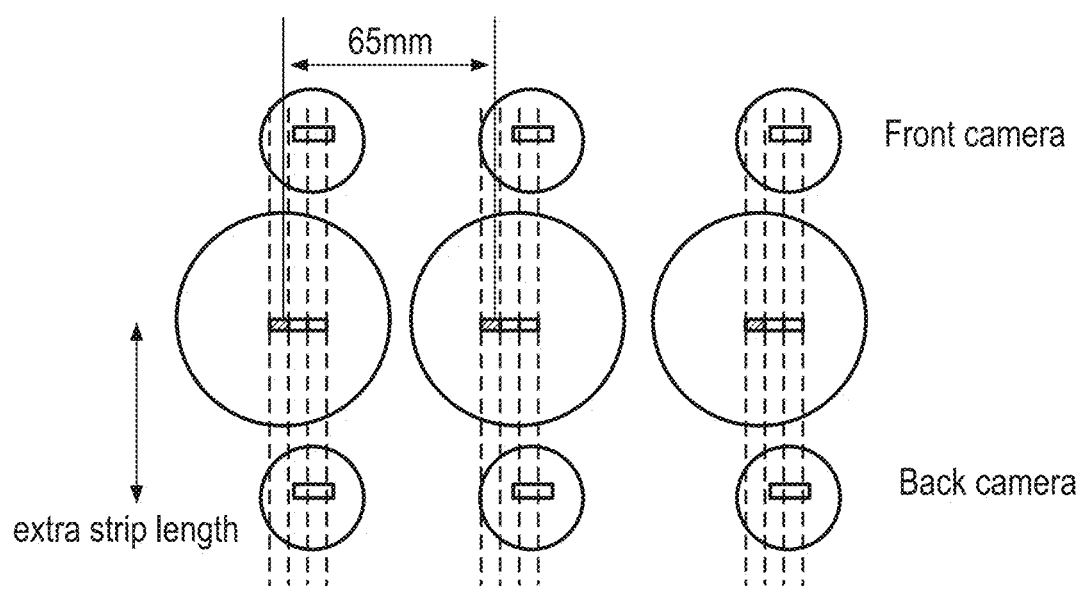
Figure 12:
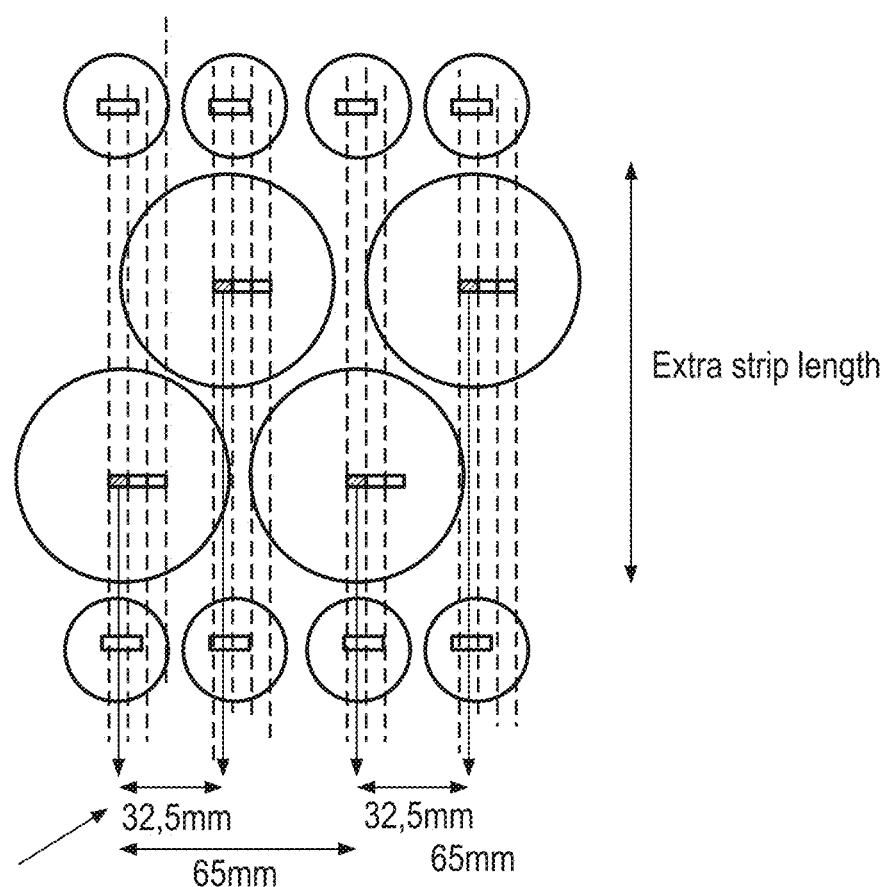
Figure 13:
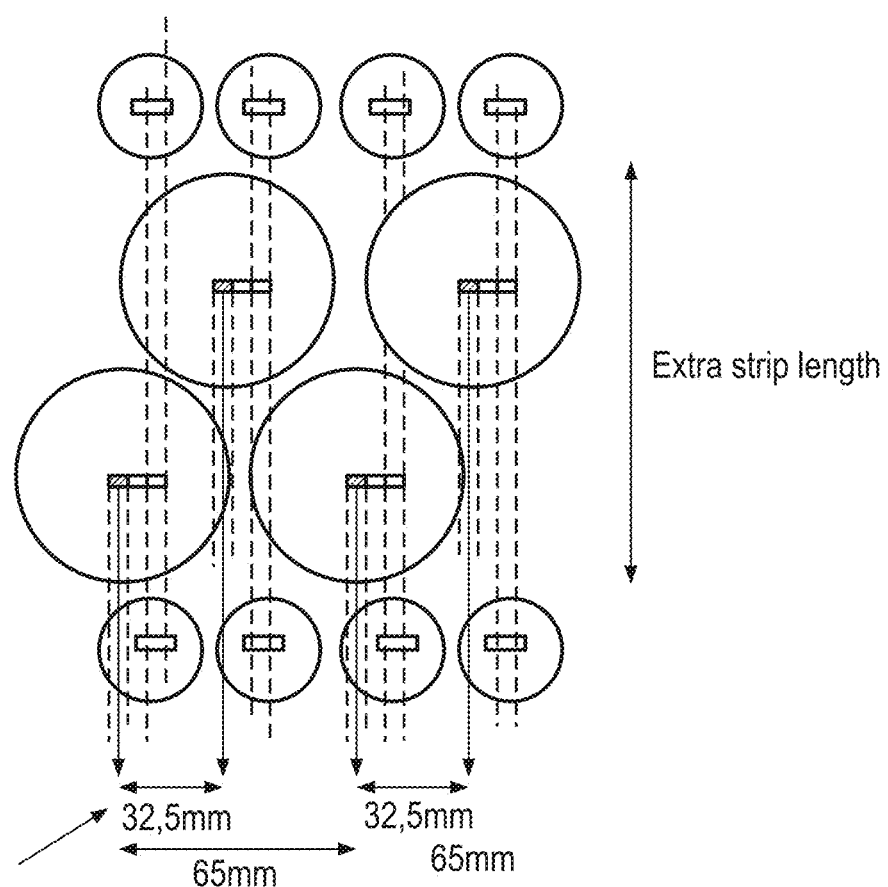

Such dies are typically 1-10 mm square, and on a 300 mm round wafer or a 600 mm×600 mm panel you will be able to mount hundreds and thousands of such dies. FIG. 6 shows two examples of wafers with dies mounted onto them. FIG. 6a shows an example of Fan Out Wafer Level Packaging (FOWLP), while FIG. 6b shows an example of Fan Out Panel Level Packaging (FOPLP).

The dies are now over-molded with a compound 23, and in such molding process the dies might slightly move or rotate. Then the base layer and the adhesive tape/material 20, 21 are removed in a special process. The result is a compound layer 24 with the dies and the die pads/electrical connection points visible from one side.

To be able to optimize the pattern to be printed onto compound layer with dies, a registration/measurement of the dies' position and rotation is required. Such optimizing is typically required in a Fanout process, where the pads/electrical connection points are to be redistributed to a wider area so that it is possible to connect them to a solderable system with larger and wider distributed connection pads. Other cases can include to Fan out the connection points to the larger interconnecting systems (such as a substrate, PCB or RDL) such that the dies connection points are routed and connected to the other electrical components on the same substrate. In this way it is avoided the packaging process of such die, —embedded die.

For example, a registration/measurement accuracy of 1 um or better is required. In such systems one or more points on each die are measured to be able to measure and calculate position error and rotation, hence the number of measurements needed can get up to the 1.000-100.000 number range. Such an amount of measurements with high accuracy will challenge the throughout, as this is very time consuming with the presently used equipment, for example registration systems in DI machines and/or measuring machines.

A DI machine based on a system with light modulator (for example DLP, LCOS etc) will typically print the pattern in stripes, where each projector/photo head will print one or several stripes. There may also be arranged multiple photo heads to increase capacity/throughput of the machine. FIGS. 7-13 illustrates use of multiple photo heads and multiple registration cameras with different position configuration.

A DI machine, like Schmol's MDI TT Ultra using Visitech's LLS 2500 Photo Head or other machine with specifications that enables printing 2 μm line/space, will typically print 10-30 stripes per photo head depending on the configuration. Hence the photo head mechanical system will scan over the area to be printed several times.

Figure 14A:
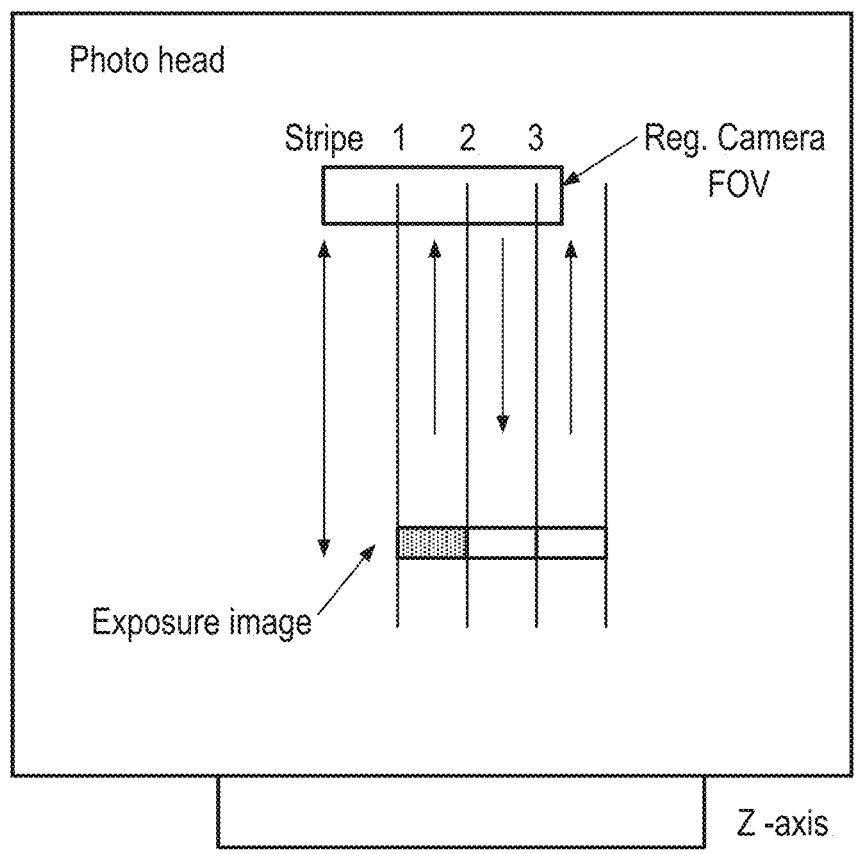
FIG. 14a-14d shows details of different embodiments of optical elements for exposure and camera capture of a device for direct imaging lithography.
Figure 14B:
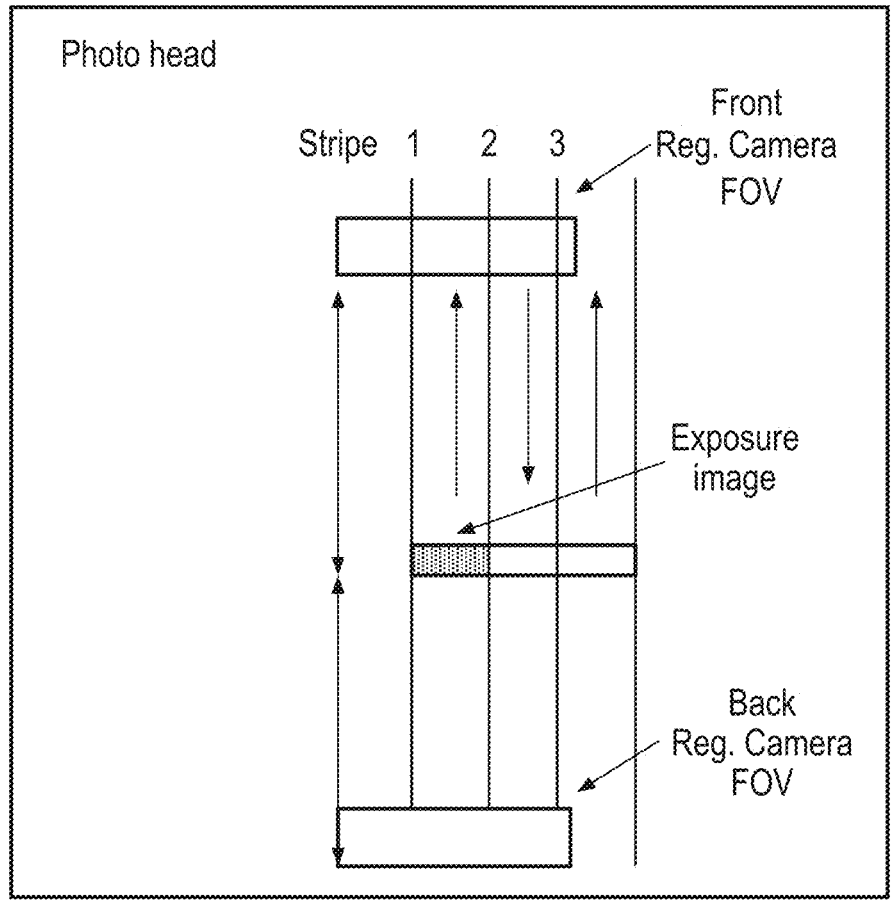
Figure 14C:
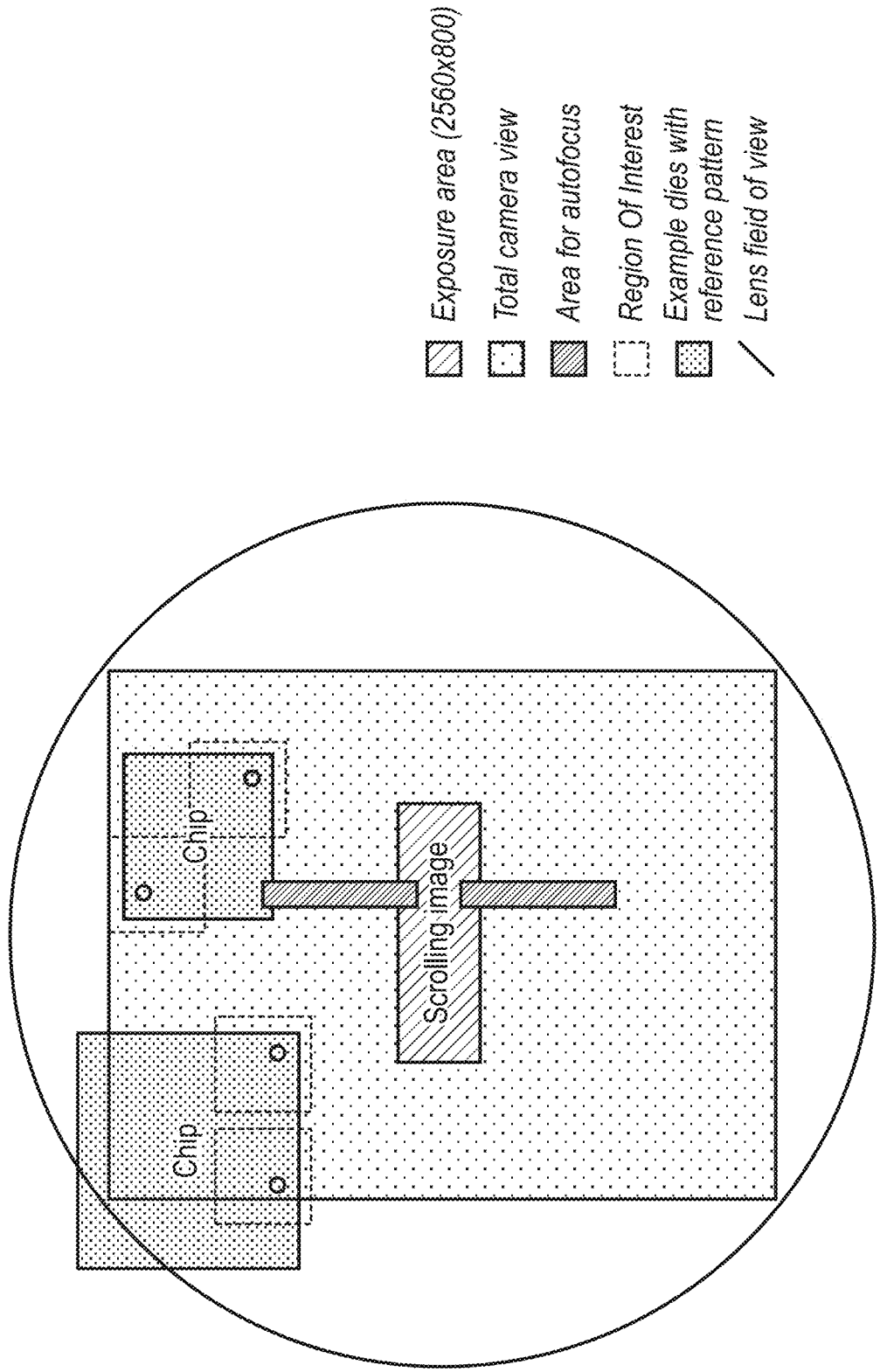

By applying registration camera(s) to the projector mechanical system, and capture/register alignment marks/reference marks in real time, this can be applied to the real time pattern warping system in the photo head along with position/rotation calculations and data feed. The photo head can then print the calculated resulting pattern on the fly. FIG. 14a illustrates this process.

Figure 14D:
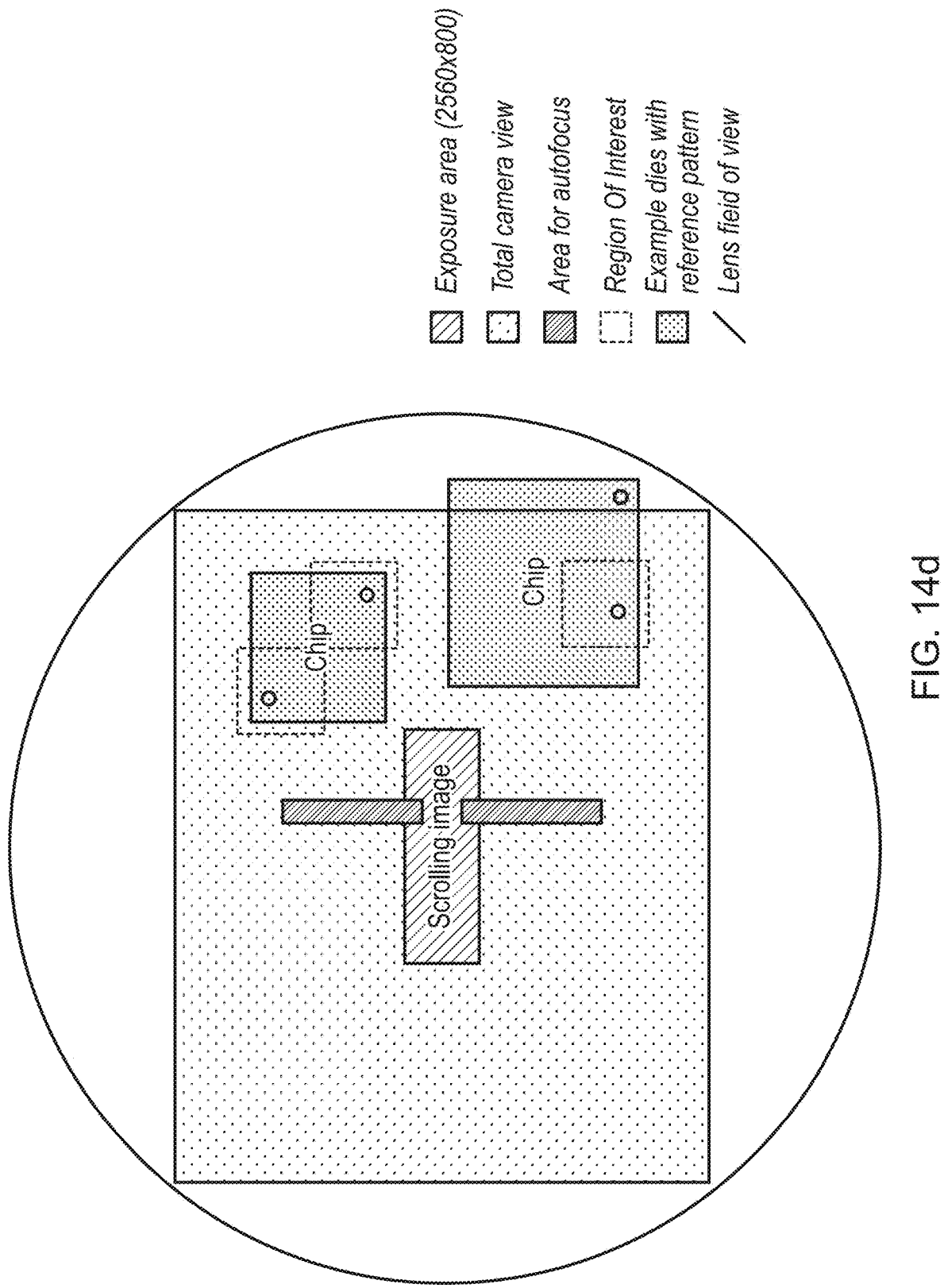

In the examples of FIG. 14a, 14d, the imaging optics and camera's optics are incorporated or arranged close to each other. The camera is here used as line sensor.

As each stripe is exposed, the system will measure the position of alignment marks in the same stripe and/or the next stripe to be printed. Simultaneously, ie. in real time, the XY position and rotation matrix for each alignment mark is calculated. The calculated position/rotation is then used by the exposure system to control the positioning of the subsequent exposed images.

The relative distance and scroll speed of the substrate, which is known by the system, can be used to determine image capture, position calculation, data transfer and image warping time window.

Further by analyzing given pattern and fiducial data, the camera area of interest can be determined with one or more areas of the camera image. This will reduce the number of camera pixels to capture, compared to the whole camera image, to be transferred and analyzed, such that the camera data transfer and the following calculation can be optimized for speed of data transfer to the calculation module.

Figure 15A:
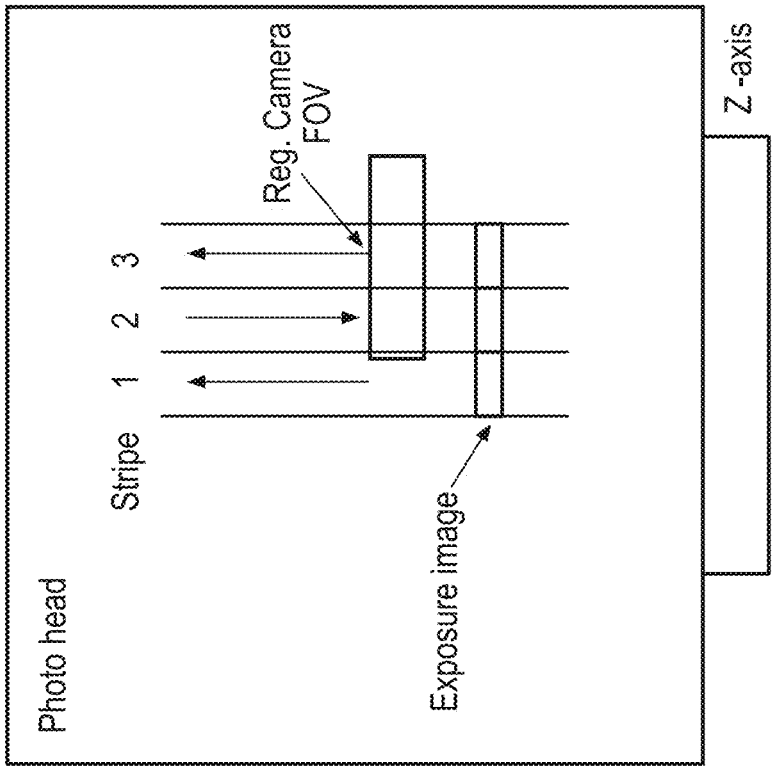
FIGS. 15a and 15b shows details of different embodiments of optical elements for exposure and camera capture of a device for direct imaging lithography.
Figure 15B:
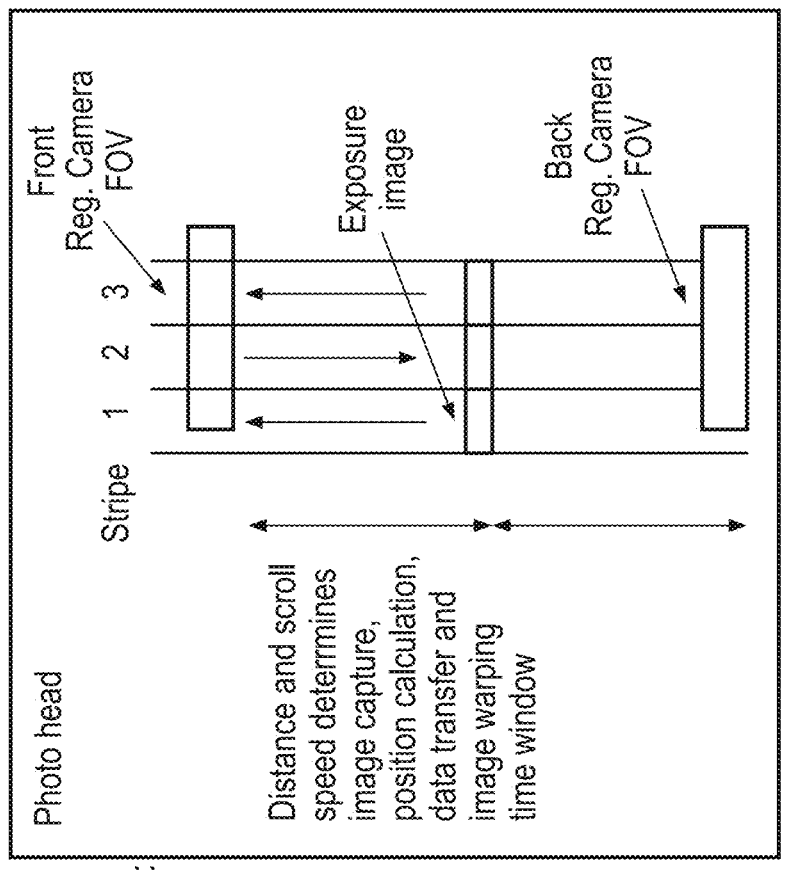

Typically the camera measures the alignment marks in front of the projected pattern as illustrated in FIGS. 14a, 14d or on the next stripe to be printed (N+1, N+2 etc) as illustrated in the example of FIGS. 15a and 15b. The choice of embodiment may depend on the time needed to do the capture, calculations and coordinate data transfer and the positioning and warping while printing.

By applying a system as described herein, the problem with high time consumption of the high volume of high accuracy measurements in fine line lithography application can be drastically reduced.

The invention claimed is:

1. A device for measuring reference points in real time during lithographic printing, comprising:
   a light source providing an exposure beam;
   a light modulator modulating the exposure beam according to an exposure pattern;
   a measurement system comprising a camera, the measurement system configured to define at least one camera area of interest to optimize fast camera data transfer and to measure a position of a number of alignment marks previously arranged on a substrate; and
   an exposure optical system comprising a control unit, the exposure optical system delivering the modulated exposure beam as an image provided by the light modulator onto the substrate;
   wherein the exposure system control unit is configured to:
   calculate the orientation of the substrate based on the position of the alignment marks simultaneously to delivering the modulated exposure beam, and
   control the delivering of the modulated exposure beam relative to the calculated orientation of the substrate.

2. The device according to claim 1, wherein the XY position and rotation matrix for each alignment mark is calculated simultaneously to the exposure, and wherein the calculated position/rotation is used in the exposure system to control the positioning of the subsequent exposed images.

3. The device according to claim 2, wherein the exposure pattern is provided in stripes, and as each stripe is exposed, the position of alignment marks in the same stripe and/or the next stripe to be printed is measured.

4. The device according to claim 1, wherein the camera is arranged to use direct high data rate transfer directly from camera chip into a FPGA or processor for fast analysis and data transfer to a pattern calculation module in the exposure optical system control unit.

5. The device according to claim 1, wherein electrical connection pads on a die are used as alignment marks.

6. The device according to claim 1, wherein body or parts of the body of a die is used as alignment marks.

7. The device according to claim 1, where the measurement system and the exposure optical system have at least partially concurrent optical paths.

8. The device according to claim 1, wherein the camera area of interest is positioned close to and mechanically connected to the exposure optical system.

9. The device according to claim 1, wherein the measurement system defines a special camera area of interest for autofocus laser light reflection detection similar to a line sensor, and utilizes the defined special camera area of interest for fast camera data transfer for autofocus calculation and autofocus regulation.

10. The device according to claim 1, wherein the light source comprises multiple light sources, with at least one wavelength.

11. The device according to claim 10, wherein the exposure optical system comprises a projection lens and the light sources are positioned and optically coupled through the projection lens.

12. The device according to claim 10, wherein the exposure optical system comprises a projection lens and the light sources are positioned in the bottom part of the exposure optical system, surrounding the projection lens.

13. A method of measuring reference points in real time during lithographic printing comprising:
   modulating an exposure beam according to an exposure pattern;
   defining at least one camera area of interest of a camera to optimize fast camera data transfer;
   measuring a position of a number of alignment marks previously arranged on a substrate using the camera;
   delivering the modulated exposure beam as an image provided by the light modulator onto the substrate;
   calculating the orientation of the substrate based on the position of the alignment marks simultaneously to delivering the modulated exposure beam; and
   controlling the delivering of the modulated exposure beam relative to the calculated orientation of the substrate.

14. The method according to claim 13, further comprising:
   calculating the XY position and rotation matrix for each alignment mark simultaneously to the exposure, and using the calculated position/rotation in the exposure system to control the positioning of the subsequent exposed images.

15. The method according to claim 13, further comprising:
   providing the exposure pattern in stripes, and as each stripe is exposed, measure the position of alignment marks in the same stripe and/or the next stripe to be printed.

16. The method according to claim 13, using direct high data rate transfer directly from the measurement to the calculation FPGA or processor for fast analysis and data transfer.

* * * * *